United States Patent
Wang et al.

(10) Patent No.: US 10,276,258 B2
(45) Date of Patent: Apr. 30, 2019

(54) MEMORY CONTROLLER FOR SELECTING READ CLOCK SIGNAL

(71) Applicant: NXP USA, INC., Austin, TX (US)

(72) Inventors: Shaohu Wang, Shanghai (CN); Bin Li, Shanghai (CN)

(73) Assignee: NXP B.V., San Jose, CA (US)

( * ) Notice: Subject to any disclaimer, the term of this patent is extended or adjusted under 35 U.S.C. 154(b) by 284 days.

(21) Appl. No.: 15/364,274

(22) Filed: Nov. 30, 2016

(65) Prior Publication Data

US 2017/0365355 A1    Dec. 21, 2017

(30) Foreign Application Priority Data

Jun. 21, 2016 (CN) .......................... 2016 1 0450837

(51) Int. Cl.

| | | |
|---|---|---|
| *G11C 29/36* | (2006.01) | |
| *G11C 29/50* | (2006.01) | |
| *G06F 1/08* | (2006.01) | |
| *G06F 1/12* | (2006.01) | |
| *G11C 7/10* | (2006.01) | |
| *G11C 7/22* | (2006.01) | |
| *G11C 29/38* | (2006.01) | |
| *G11C 29/44* | (2006.01) | |
| *G06F 1/10* | (2006.01) | |
| *G11C 29/02* | (2006.01) | |
| *G11C 29/12* | (2006.01) | |

(52) U.S. Cl.
CPC ................ *G11C 29/36* (2013.01); *G06F 1/08* (2013.01); *G06F 1/10* (2013.01); *G06F 1/12* (2013.01); *G11C 7/1012* (2013.01); *G11C 7/22* (2013.01); *G11C 29/023* (2013.01); *G11C 29/028* (2013.01); *G11C 29/12015* (2013.01); *G11C 29/38* (2013.01); *G11C 29/44* (2013.01); *G11C 29/50012* (2013.01); *G11C 2029/3602* (2013.01)

(58) Field of Classification Search
CPC ......... G11C 29/36; G11C 7/1012; G11C 7/22; G11C 29/023; G11C 29/028; G11C 29/12015; G11C 29/38; G11C 29/44; G11C 29/50012; G11C 2029/3602; G06F 1/08; G06F 1/10; G06F 1/12
See application file for complete search history.

(56) References Cited

U.S. PATENT DOCUMENTS

| | | |
|---|---|---|
| 8,589,717 B1 | 11/2013 | Davis et al. |
| 2001/0028265 A1 * | 10/2001 | Nitta .......................... G06F 1/10 |
| | | 327/262 |

(Continued)

*Primary Examiner* — April Y Blair
*Assistant Examiner* — Dipakkumar B Gandhi
(74) *Attorney, Agent, or Firm* — Charles E. Bergere (57) ABSTRACT

A memory controller includes a clock delay generator, a set of flip-flops, and a control circuit, and is connected to a processor and a memory. The clock delay generator receives a clock signal from the processor, delays the clock signal by a set of delay time intervals, and generates a set of delayed clock signals. The flip-flops receive a test pattern and read data from the memory, sample the test pattern and the read data based on the delayed clock signals, and generate a set of sampled test patterns and a set of sampled read data. The control circuit identifies a sampled test pattern that is equal to the test pattern and the corresponding delayed clock signal as a read clock signal, and outputs the sampled read data that corresponds to the (delayed) read clock signal.

17 Claims, 3 Drawing Sheets

(56) References Cited

U.S. PATENT DOCUMENTS

| | | | | |
|---|---|---|---|---|
| 2002/0147898 A1* | 10/2002 | Rentschler | ............ | G06F 12/04 |
| | | | | 711/170 |
| 2005/0138277 A1* | 6/2005 | Koo | ................ | G06F 13/1689 |
| | | | | 711/105 |
| 2006/0107011 A1* | 5/2006 | Nystuen | ............ | G06F 13/4234 |
| | | | | 711/167 |
| 2006/0248305 A1* | 11/2006 | Fang | ................ | G11C 7/1012 |
| | | | | 711/167 |

* cited by examiner

MEMORY CONTROLLER FOR SELECTING READ CLOCK SIGNAL

BACKGROUND

The present invention generally relates to integrated circuits (ICs), and more particularly, to a memory controller.

Many ICs include a processor, a memory controller, and a memory. The processor generates a clock signal and data. Then, during a write transaction, the processor stores the data in the memory by way of the memory controller. During a read transaction, the processor reads the data from the memory by way of the memory controller.

Improvements in semiconductor technology have led to an increase in the processing speed of the processors, i.e., the speed of the high frequency clock signal to the processor. A conventional memory controller samples the data at a sampling rate based on at least one of the rising and falling edges of the clock signal. However, during a read transaction, when the memory controller receives data, the data is unstable for an interval of time, which is referred to as a data skew time interval. After the elapse of the data skew time, the memory controller receives the data, which now should be stable and not have any errors.

When the data is stable, the memory controller waits for a set up time interval to elapse before it can accurately sample the data. A predetermined time interval equals a sum of the data skew time and the set up time. If the memory controller samples the read data before the predetermined time interval has elapsed, then the data may not include errors. Hence, the data sampling rate during a read transaction depends on the frequency of the clock signal and the predetermined time interval.

The time period of a sampling cycle is equal to a sum of the time period of the clock cycle and the predetermined time interval. The sampling rate is equal to an inverse of the time period of the sampling cycle. The time period of the sampling cycle is greater than the time period of the clock cycle. Hence, the sampling rate is less than the frequency of the clock signal, i.e., the memory controller reads data at a slower rate than the rate at which the processor operates. Thus, a delay is introduced in the operation of the processor.

In one known technique to avoid the aforementioned problem, the memory controller includes a clock generator and a control circuit to generate a first read clock signal at a first frequency and at least one training packet of data, respectively, where the first frequency is greater than the frequency of the clock signal generated by the processor. The memory controller generates the data training packet to determine the data skew time interval, and stores the training packet in the memory. When the processor generates a read transaction, the memory controller receives the training packet and samples the training packet using the first read clock signal. The memory controller detects an earliest and a latest transition of the training packet. Thus, the memory controller determines a time interval during which the sampled data is inaccurate, based on the earliest and latest transitions, i.e., the memory controller determines the data skew time interval. The memory controller generates a second read clock signal at a second frequency, based on the data skew time interval. The time period of the second read clock signal is greater than or equal to the data skew time interval. Then the memory controller samples the training packet using the second read clock signal and generates a sampled training packet. The memory controller checks whether the training packet has been accurately sampled by comparing the training packet with the sampled training packet. If the training packet has been accurately sampled, the memory controller knows that it can sample read data from the memory using the second read clock signal. However, if the training packet has not been accurately sampled, the memory controller re-determines the data skew time interval. This process is repeated until the read clock signal used can accurately sample the training packet. Since the time period of the read clock signal is based on only the data skew time interval and not on the sum of a time period of the clock signal and the data skew time, the rate at which the memory controller samples the read data is greater than the rate at which the conventional memory controller samples the read data. However, the memory controller may require multiple iterations to determine an appropriate read clock signal. Thus, the memory controller introduces a delay in the execution of the read transaction and consequently, a delay in the operation of the processor. Further, the clock generator increases the complexity and power consumption of the memory controller.

It would be advantageous to have a memory controller that generates a read clock signal to sample data stored in a memory, ensures that the data is sampled accurately at a high frequency without causing a significant increase in the complexity of the memory controller, and does not increase the power consumption of the memory controller.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a memory controller for processing a read transaction request is provided. The memory controller is connected to a processor for receiving the read transaction request and a clock signal, and to a memory for receiving read data corresponding to the read transaction request. The memory controller samples the read data and outputs sampled read data to the processor. The memory controller includes a clock delay generator, a set of flip-flops, and a control circuit. The clock delay generator is connected to the processor and receives the clock signal. The clock delay generator delays the clock signal by a set of delay time intervals and generates corresponding set of delayed clock signals. The set of flip-flops is connected to the clock delay generator and the memory for receiving the set of delayed clock signals and the read data, respectively. The set of flip-flops further receives a test pattern, samples the test pattern and the read data using each of the delayed clock signals, and generates a set of sampled test patterns corresponding to the set of delayed clock signals and a set of sampled read data corresponding to the set of delayed clock signals. The control circuit is connected to the set of flip-flops for receiving the set of sampled test patterns and the set of sampled read data, and to the clock delay generator for receiving the set of delayed clock signals. The control circuit receives the test pattern and compares it to each of the sampled test patterns, and then selects one of the delayed clock signals as a read clock signal based on the comparison results. The control circuit selects the one of the delayed clock signal as the read clock signal when a corresponding sampled test pattern is equal to the test pattern. The control circuit outputs sampled read data corresponding to the read clock signal.

In another embodiment, the present invention comprises an integrated circuit (IC) including a processor, a memory controller, and a memory. The processor generates a read transaction request and a clock signal. The memory controller is connected to the processor for receiving the read transaction request and the clock signal. The memory is connected to the memory controller and stores the read data and the test pattern. The memory controller receives the read data and the test pattern and generates a read clock signal for sampling the read data. The memory controller outputs sampled read data to the processor. The memory controller includes a clock delay generator, a set of flip-flops, and a control circuit. The clock delay generator is connected to the processor and receives the clock signal. The clock delay generator delays the clock signal by a set of delay time intervals and generates a set of delayed clock signals based on the set of corresponding delay time intervals. The set of flip-flops is connected to the clock delay generator and the memory for receiving the set of delayed clock signals and the read data, respectively. The set of flip-flops also receives the test pattern, samples the test pattern and the read data using each of the delayed clock signals, and generates a set of sampled test patterns corresponding to the set of delayed clock signals and a set of sampled read data corresponding to the set of delayed clock signals. The control circuit is connected to the set of flip-flops for receiving the sampled test patterns and the sampled read data, and to the clock delay generator for receiving the set of delayed clock signals. The control circuit receives the test pattern and compares it with each of the sampled test patterns of the set of sampled test patterns, and selects one of the delayed clock signals of the set of delayed clock signals as a read clock signal based on the comparison of the test pattern with the set of sampled test patterns. The control circuit selects the one delayed clock signal as the read clock signal when a corresponding sampled test pattern is equal to the test pattern. The control circuit then outputs the sampled read data corresponding to the read clock signal.

Various embodiments of the present invention include a memory controller connected to a processor and a memory. The memory controller includes a clock delay generator, a set of flip-flops, and a control circuit. The clock delay generator receives a clock signal from the processor, delays the clock signal by a set of delay time intervals, and generates a set of delayed clock signals. The flip-flops receive a test pattern and read data from the memory, sample the test pattern and the read data using each of the delayed clock signals, and generate a set of sampled test patterns and a set of sampled read data. The control circuit identifies a sampled test pattern that matches the test pattern, and selects the corresponding delayed clock signal as a read clock signal. The control circuit outputs to the processor the sampled read data that corresponds to the read clock signal.

Each of the delayed clock signals has a frequency that is equal to the frequency of the clock signal. Hence, the memory controller operates at the same frequency as the processor. This does not result in a significant increase in the complexity of the memory controller and reduces the power consumption of the memory controller as compared to a conventional memory controller. The memory controller selects a delayed clock signal of the set of delayed clock signals as the read clock signal. The memory controller samples the read data using the read clock signal after a predetermined time interval has elapsed. Thus, the memory controller ensures that the read data is sampled accurately. A sampling frequency of the read data depends on the frequency of the read clock signal and not on both the predetermined time interval and the frequency of the read clock signal. Thus, the memory controller matches the sampling frequency of the read data with the frequency of the clock signal provided by the processor.

Figure 1:
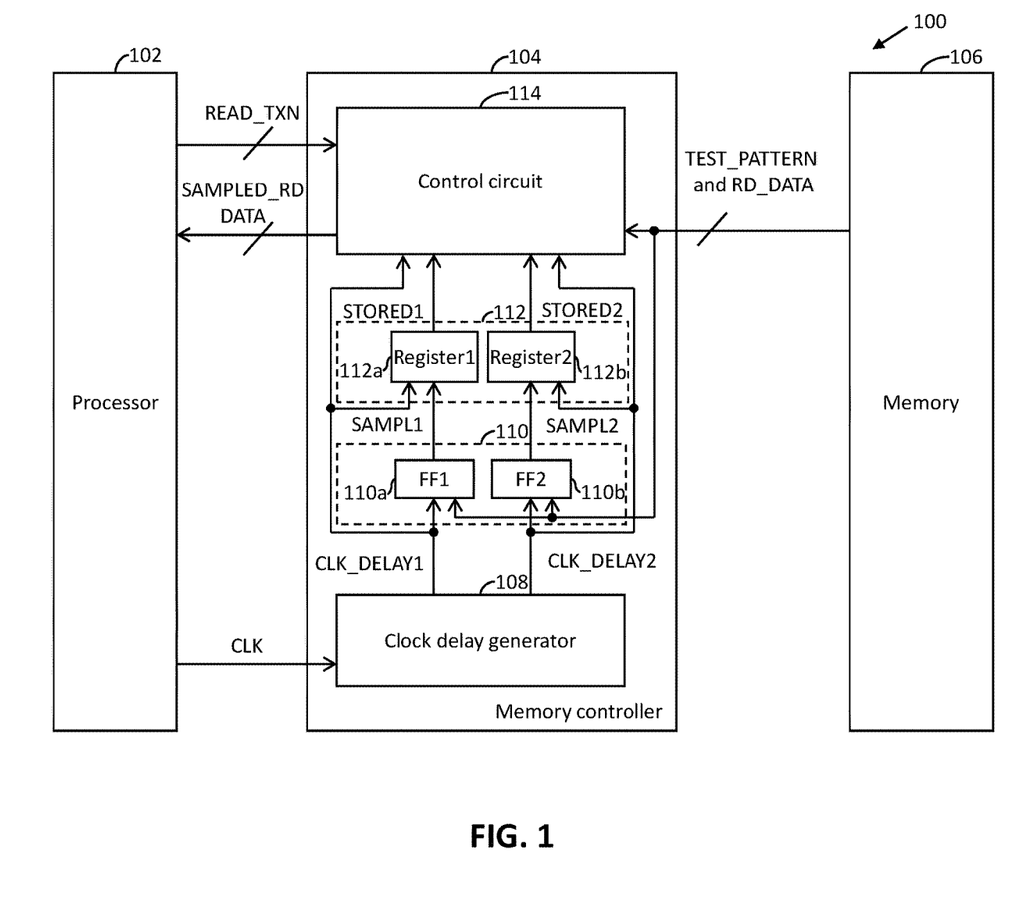
FIG. 1 is a schematic block diagram of an integrated circuit (IC) that includes a memory controller in accordance with an embodiment of the present invention.

Referring now to FIG. 1, a schematic block diagram of an integrated circuit (IC) 100 in accordance with an embodiment of the present invention is shown. The IC 100 includes a processor 102, a memory controller 104, and a memory 106. The memory controller 104 includes a clock delay generator 108, a set of flip-flops 110 —two of which are shown—a first flip-flop 110a and a second flip-flop 110b , a set of registers 112—two of which are shown—a first register 112a and a second register 112b , and a control circuit 114. The memory 106 may be a NAND flash memory or a NOR flash memory.

The memory 106 stores read data RD_DATA and a test pattern TEST_PATTERN. The processor 102 generates a read transaction READ_TXN to read the read data RD_DATA by way of the memory controller 104. The processor 102 also generates a clock signal CLK. The memory controller 104 determines a read clock signal to accurately sample the read data RD_DATA.

The clock delay generator 108 is connected to the processor 102 and receives the clock signal CLK. The clock delay generator 108 delays the clock signal CLK by a set of delay time intervals $T_{DELAY}$, and generates a corresponding set of delayed clocked signals CLK_DELAY—two of which are shown—a first delayed clock signal CLK_DELAY1 and a second delayed clock signal CLK_DELAY2. The first and second delayed clock signals CLK_DELAY1 and CLK_DELAY2 are delayed by first and second delay time intervals $T_{DELAY1}$ and $T_{DELAY2}$, respectively.

The number of delayed clock signals of the set of delayed clock signals CLK_DELAY is based on the time period of a clock cycle of the clock signal CLK and a predetermined time interval, which is a sum of a data skew time interval $T_{DATA\_SKEW}$ and a set up time interval $T_{SETUP}$. The data skew time interval $T_{DATA\_SKEW}$ is the duration of time during which the test pattern TEST_PATTERN and the read data READ_DATA are unstable. After the elapse of the data skew time interval $T_{DATA\_SKEW}$, the test pattern TEST_PATTERN and the read data READ_DATA are stable. The set up time interval $T_{SETUP}$ is the duration of time for which the test pattern TEST_PATTERN and the read data READ_DATA are stable. Further, after the elapse of the set up time interval $T_{SETUP}$, the test pattern TEST_PATTERN and the read data READ_DATA are accurately sampled. A time difference between the consecutive delay time intervals $T_{DELAY}$ is greater than or equal to the predetermined time interval.

In an embodiment, the time differences between the consecutive delay time intervals $T_{DELAY}$ are equal. Hence, the values of the delay time intervals $T_{DELAY}$ are consecutive multiples of a value of the first delay time interval $T_{DELAY1}$, i.e., the value of the second delay time interval $T_{DELAY2}$ is equal to twice the value of the first delay time interval $T_{DELAY1}$. For example, the time period of a clock cycle of the clock signal CLK is 5 milliseconds (ms) and the predetermined time interval is 1 ms. Hence, the time difference between the consecutive delay time intervals $T_{DELAY}$ is at least equal to 1 ms and the number of delayed clock signals is 5.

The first and second flip-flops 110a and 110b are connected to the memory 106 and receive the test pattern TEST_PATTERN and the read data RD_DATA. Further, the first and second flip-flops 110a and 110b are connected to the clock delay generator 108 and receive the first and second delayed clock signals CLK_DELAY1 and CLK_DELAY2, respectively. In one embodiment, the first flip-flop 110a receives and samples the test pattern TEST_PATTERN and the read data RD_DATA in first and second clock cycles of the first delayed clock signal CLK_DELAY1. The second flip-flop 110b receives and samples the test pattern TEST_PATTERN and the read data RD_DATA in first and second clock cycles of the second delayed clock signal CLK_DELAY2. The first flip-flop 110a accurately samples the read data RD_DATA and the test pattern TEST_PATTERN after the elapse of at least the predetermined time interval.

In one embodiment, the first flip-flop 110a samples the test pattern TEST_PATTERN and the read data RD_DATA at the rising edge of the first delayed clock signal CLK_DELAY1. In another embodiment, the first flip-flop 110a samples the test pattern TEST_PATTERN and the read data RD_DATA at a falling edge of the first delayed clock signal CLK_DELAY1. In yet another embodiment, the first flip-flop 110a samples the test pattern TEST_PATTERN and the read data RD_DATA at both the rising and falling edges of the first delayed clock signal CLK_DELAY1.

The first flip-flop 110a generates a first sampled test pattern SAMPL_TEST_PATTERN1 and first sampled read data SAMPL_RD_DATA1 when the first flip-flop 110a receives the test pattern TEST_PATTERN and the read data RD_DATA in the first and second clock cycles, respectively. The first sampled test pattern SAMPL_TEST_PATTERN1 and the first sampled read data SAMPL_RD_DATA1 are collectively referred to as first sampled data SAMPL1. The second flip-flop 110b is structurally and functionally similar to the first flip-flop 110a and generates at least one of a second sampled test pattern SAMPL_TEST_PATTERN2 and second sampled read data SAMPL_RD_DATA1. The second sampled test pattern SAMPL_TEST_PATTERN2 and the second sampled read data SAMPL_RD_DATA2 are collectively referred to as second sampled data SAMPL2.

In one embodiment, the number of flip-flops of the set of flip-flops 110 is equal to one more than the number of delayed clock signals of the set of delayed clock signals CLK_DELAY. The set of flip-flops 110 also includes a third flip-flop (not shown) that receives the clock signal CLK without a delay. In another embodiment, the number of flip-flops of the set of flip-flops 110 is equal to the number of delayed clock signals of the set of delayed clock signals CLK_DELAY.

The set of registers 112 is connected to the clock delay generator 108 and receives the corresponding set of delayed clock signals CLK_DELAY. The first register 112a and the second register 112b receive the first delayed clock signal CLK_DELAY1 and the second delayed clock signal CLK_DELAY2, respectively. The first register 112a is connected to the first flip-flop 110a and receives the first sampled test pattern SAMPL_TEST_PATTERN1 and the first sampled read data SAMPL_RD_DATA1 in the first and second clock cycles, respectively. Similarly, the second register 112b is connected to the second flip-flop 110b and receives the second sampled test pattern SAMPL_TEST_PATTERN2 and the second sampled read data SAMPL_RD_DATA2 in the first and second clock cycles, respectively.

The first register 112a stores the first sampled test pattern SAMPL_TEST_PATTERN1 and outputs it as a first stored test pattern STORED_TEST_PATTERN1. The first register 112a stores the first sampled read data SAMPL_RD_DATA1 and outputs it as first stored read data STORED_RD_DATA1. Similarly, the second register 112b stores the second sampled test pattern SAMPL_TEST_PATTERN2 and outputs it as a second stored test pattern STORED_TEST_PATTERN2. The second register 112b stores the second sampled read data SAMPL_RD_DATA2 and outputs it as second stored read data STORED_RD_DATA2. The first stored test pattern STORED_TEST_PATTERN1 and the first stored read data STORED_RD_DATA1 are collectively referred to as first stored data STORED1. The second stored test pattern STORED_TEST_PATTERN2 and the second stored read data STORED_RD_DATA2 are collectively referred to as second stored data STORED2.

The control circuit 114 is connected to the processor 102 to receive the read transaction READ_TXN and the memory 106 to receive the test pattern TEST_PATTERN and the read data RD_DATA. The control circuit 114 is also connected to the set of registers 112 to receive the first and second stored data STORED1 and STORED2 and the clock delay generator 108 to receive the first and second delayed clock signals CLK_DELAY1 and CLK_DELAY2. The control circuit 114 compares each of the first and second stored test patterns STORED_TEST_PATTERN1 and STORED_TEST_PATTERN2 with the test pattern TEST_PATTERN.

When the first stored test pattern STORED_TEST_PATTERN1 equals the test pattern TEST_PATTERN, the control circuit 114 determines the first delayed clock signal CLK_DELAY1 as the read clock signal. Similarly, when the second stored test pattern STORED_TEST_PATTERN2 equals the test pattern TEST_PATTERN, the control circuit 114 determines the second delayed clock signal CLK_DELAY2 as the read clock signal. Thus, the control circuit 114 outputs either of the first or second stored read data STORED_RD_DATA1 or STORED_RD_DATA2 corresponding to the read clock signal.

In an embodiment, the set of delayed clock signals CLK_DELAY includes first through eighth delayed clock signals CLK_DELAY1-CLK_DELAY8 (not shown), the set of delay time intervals $T_{DELAY}$ include first through eighth delay time intervals $T_{DELAY1}$-$T_{DELAY8}$, the set of flip-flops 110 includes first through eighth flip-flops 110a-110h (not shown), and the set of registers 112 includes first through eighth registers 112a-112h (not shown). In an example, the second, third, and fourth stored test patterns STORED_TEST_PATTERN2, STORED_TEST_PATTERN3, and STORED_TEST_PATTERN4 are equal to the test pattern TEST_PATTERN. Hence, the control circuit 114 selects the third delayed clock signal CLK_DELAY3 as the read clock signal. The selection of the third delayed clock signal CLK_DELAY3 ensures that the predetermined time interval and a time difference between the third and second delay time intervals $T_{DELAY3}$ and $T_{DELAY2}$ have elapsed. Thus, the memory controller 104 accurately samples the read data RD_DATA.

In another example, the first and second stored test patterns STORED_TEST_PATTERN1 and STORED_TEST_PATTERN2 match the test pattern TEST_PATTERN. The third stored pattern STORED_TEST_PATTERN3 does not match the test pattern TEST_PATTERN. Hence, the control circuit 114 selects the first delayed clock signal CLK_DELAY1 as the read clock signal. In yet another example, the seventh and eighth stored test patterns STORED_TEST_PATTERN7 and STORED_TEST_PATTERN8 match the test pattern TEST_PATTERN. The sixth stored pattern STORED_TEST_PATTERN6 does not match the test pattern TEST_PATTERN. Hence, the control circuit 114 selects the eighth delayed clock signal CLK_DELAY8 as the read clock signal.

Figure 2:
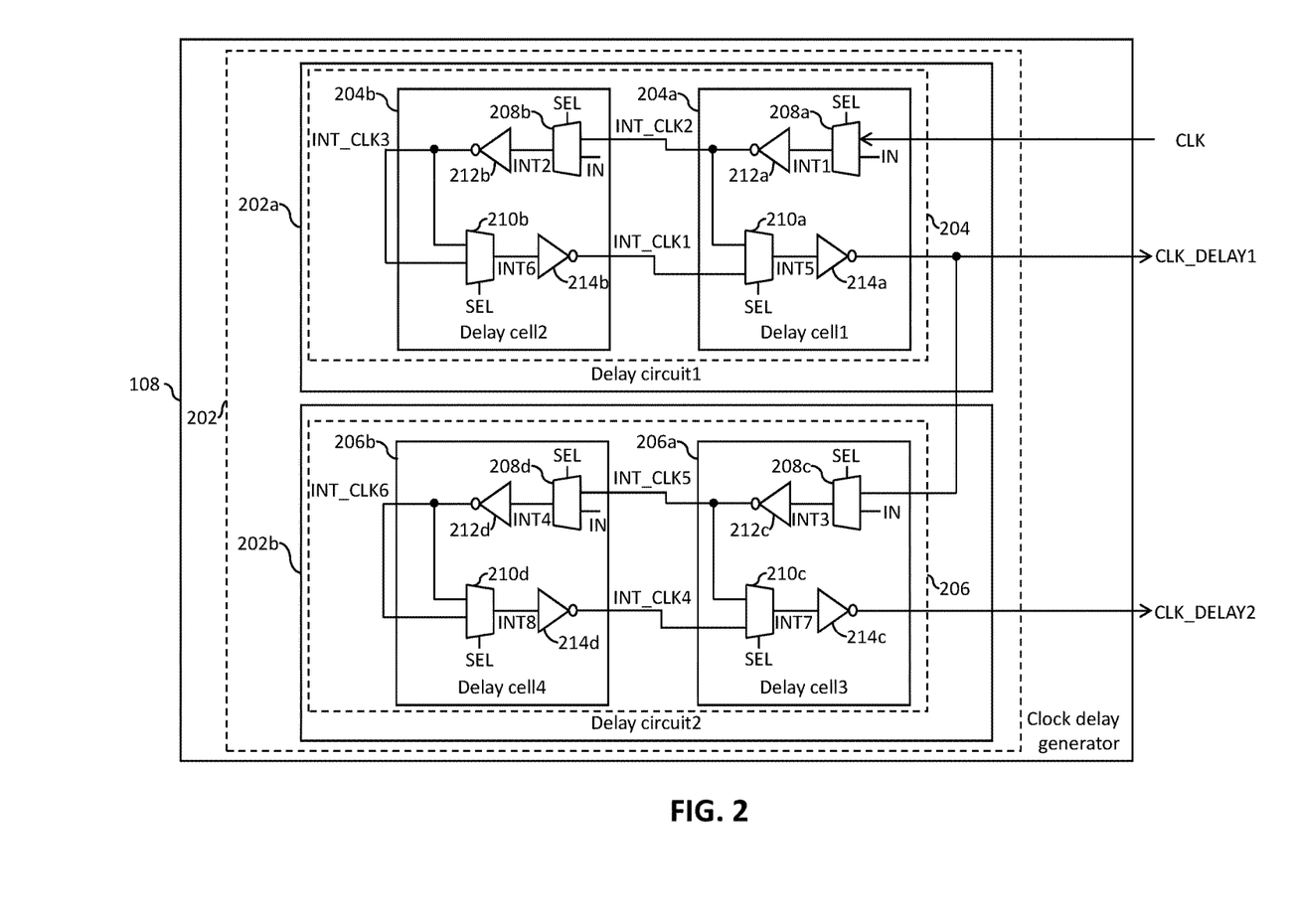
FIG. 2 is a schematic block diagram of a clock delay generator of the memory controller of FIG. 1 in accordance with an embodiment of the present invention.

Referring now to FIG. 2, a schematic block diagram of the clock delay generator 108 in accordance with an embodiment of the present invention is shown. The clock delay generator 108 includes a set of delay circuits 202—two of which are shown—first and second delay circuits 202a and 202b. Each delay circuit of the set of delay circuits 202 includes a set of delay cells. The first delay circuit 202a includes a first set of delay circuits 204—two of which are shown—first and second delay cells 204a and 204b, and the second delay circuit 202b includes a second set of delay cells 206—two of which are shown—third and fourth delay cells 206a and 206b.

The first delay cell 204a is connected to the processor 102 to receive the clock signal CLK and the second delay cell 204b to receive a first intermediate clock signal INT_CLK1. The first delay cell 204a generates a second intermediate clock signal INT_CLK2 and the first delayed clock signal CLK_DELAY1. The second delay cell 204b is connected to the first delay cell 204a and receives the second intermediate clock signal INT_CLK2 and a third intermediate clock signal INT_CLK3. The second delay cell 204b generates the first intermediate clock signal INT_CLK1 and the third intermediate clock signal INT_CLK3.

The second intermediate clock signal INT_CLK2 is a delayed version of the clock signal CLK. The third intermediate clock signal INT_CLK3 is a delayed version of the second intermediate clock signal INT_CLK2. The first intermediate clock signal INT_CLK1 is a delayed version of the third intermediate clock signal INT_CLK3. The first delayed clock signal CLK_DELAY1 is a delayed version of the first intermediate clock signal INT_CLK1. The first and second delay cells 204a and 204b introduce a delay that is equal to the first delay time interval $T_{DELAY1}$ in the clock signal CLK.

Each delay cell of the first through fourth delay cells 204a, 204b, 206a, and 206b includes two multiplexers 208 and 210 (or muxes 208 and 210), and two inverters 212 and 214. In one embodiment, the two muxes 208 and 210 are 2:1 multiplexers. Each mux 208 has a first input terminal to receive one of the clock signal CLK, the second intermediate clock signal INT_CLK2, the first delayed clock signal CLK_DELAY1, and the fifth intermediate clock signal INT_CLK5, a second input terminal to receive an input signal IN, and a select terminal to receive a select signal SEL, and an output terminal to output one of the clock signal CLK and the input signal IN as a first intermediate signal INT1, one of the second intermediate clock signal INT_CLK2 and the input signal IN as a second intermediate signal INT2, one of the first delayed clock signal CLK_DELAY1 and the input signal IN as a third intermediate signal INT3, and one of the fifth intermediate clock signal INT_CLK5 and the input signal IN as a fourth intermediate signal INT4.

Each mux 210 has a first input terminal to receive one of the first intermediate clock signal INT_CLK1, the third intermediate clock signal INT_CLK3, the fourth intermediate clock signal INT_CLK4, and the sixth intermediate clock signal INT_CLK6. Each mux 210 has a second input terminal to receive one of the second intermediate clock signal INT_CLK2, the third intermediate clock signal INT_CLK3, the fifth intermediate clock signal INT_CLK5, and the sixth intermediate clock signal INT_CLK6, and a select terminal to receive the select signal SEL. Each mux 210 outputs one of the first and second intermediate clock signals INT_CLK1 and INT_CLK2 as a fifth intermediate signal INT5, the third intermediate clock signal INT_CLK3 as a sixth intermediate signal INT6, one of the fourth and fifth intermediate clock signals INT_CLK4 and INT_CLK5 as a seventh intermediate signal INT7, and the sixth intermediate clock signal INT_CLK6 as an eighth intermediate signal INT8.

The first delay cell 204a includes first and second mux 208a and 210a, and first and second inverters 212a and 214a. The second delay cell 204b includes third and fourth muxes 208b and 210b, and third and fourth inverters 212b and 214b. The third delay cell 206a includes fifth and sixth muxes 208c and 210c, and fifth and sixth inverters 212c and 214c. The fourth delay cell 206b includes seventh and eighth muxes 208d and 210d, and seventh and eighth inverters 212d and 214d.

The first mux 208a has a first input terminal that is connected to the processor 102 to receive the clock signal CLK. The first mux 208a has a second input terminal that receives the input signal IN. In one embodiment, the input signal IN has a predetermined value, i.e., it is set at a first logic state. The first mux 208a has a select terminal that receives the select signal SEL. If SEL is high, then the first mux 208a outputs the clock signal CLK as the first intermediate signal INT1. The first inverter 212a is connected to the output terminal of the first mux 208a and receives the first intermediate signal INT1. The first inverter 212a outputs the second intermediate clock signal INT_CLK2, which is an inverted version of the clock signal CLK.

The second mux 210a has a first input terminal that receives the first intermediate clock signal INT_CLK1. The second mux 210a has a second input terminal connected to the first inverter 212a and receives the second intermediate clock signal INT_CLK2. The second mux 210a has a select terminal that receives the select signal SEL. When the select signal SEL is high, then the second mux 210a outputs the first intermediate clock signal INT_CLK1 as the fifth intermediate signal INT5. The second inverter 214a is connected to the output terminal of the second mux 210a and receives the fifth intermediate signal INT5. The second inverter 214a outputs the first delayed clock signal CLK_DELAY1.

The third mux 208b has a first input terminal connected to the first inverter 212a to receive the second intermediate clock signal INT_CLK2. The third mux 208b has a second input terminal that receives the input signal IN. In one embodiment, the input signal IN is tied either high or low so it has a predetermined value. The third mux 208b has a select terminal that receives the select signal SEL. If the select signal SEL is high, then the third mux 208b outputs the second intermediate clock signal INT_CLK2 as the second intermediate signal INT2. The third inverter 212b is connected to the output terminal of the third multiplexer 208b and receives the second intermediate signal INT2. The third inverter 212b outputs the third intermediate clock signal INT_CLK3, which is an inverted version of the second intermediate clock signal INT_CLK2.

The fourth mux 210b has a first input terminal connected to the third inverter 212b and receives the third intermediate clock signal INT_CLK3. The fourth mux 210b has a second input terminal connected to the third inverter 212b and receives the third intermediate clock signal INT_CLK3. The fourth mux 210b has a select terminal that receives the select signal SEL. If the select signal SEL is high, then the fourth mux 210b will output the third intermediate clock signal INT_CLK3 as the sixth intermediate signal INT6. The fourth inverter 214b is connected to the output terminal of the fourth mux 210b and receives the sixth intermediate signal INT6. The fourth inverter 214b outputs the first intermediate clock signal INT_CLK1.

The fifth mux 208c has a first input terminal connected to the second inverter 214a to receive the first delayed clock signal CLK_DELAY1, and a second input terminal that receives the input signal IN. In one embodiment, the input signal IN is tied either high or low so that it has predetermined value. The fifth mux 208c has a select terminal that receives the select signal SEL. If the select signal SEL is high, then the fifth mux 208c will output the first delayed clock signal CLK_DELAY1 as the third intermediate signal INT3. The fifth inverter 212c is connected to the output terminal of the fifth multiplexer 208c and receives the third intermediate signal INT3. The fifth inverter 212c outputs the fifth intermediate clock signal INT_CLK5, which is an inverted version of the first delayed clock signal CLK_DELAY1.

The sixth mux 210c has a first input terminal that receives the fourth intermediate clock signal INT_CLK4, and a second input terminal connected to the fifth inverter 212c and receives the fifth intermediate clock signal INT_CLK5. The sixth mux 210c has a select terminal that receives the select signal SEL. If the select signal SEL is high, then the sixth mux 210c outputs the fourth intermediate clock signal INT_CLK4 as the seventh intermediate signal INT7. The sixth inverter 214c is connected to the output terminal of the sixth multiplexer 210c and receives the seventh intermediate signal INT7. The sixth inverter 214c outputs the second delayed clock signal CLK_DELAY2.

The seventh mux 208d has a first input terminal connected to the fifth inverter 212c to receive the fifth intermediate clock signal INT_CLK5, and a second input terminal that receives the input signal IN. In one embodiment, the input signal IN is tied either high or low so that it has a predetermined value. The seventh mux 208d has a select terminal that receives the select signal SEL. If the select signal SEL is high, then the seventh mux 208d outputs the fifth intermediate clock signal INT_CLK5 as the fourth intermediate signal INT4. The seventh inverter 212d is connected to the output terminal of the seventh multiplexer 208d and receives the fourth intermediate signal INT4. The seventh inverter 212d outputs the sixth intermediate clock signal INT_CLK6, which is an inverted version of the fifth intermediate clock signal INT_CLK5.

The eighth mux 210d has a first input terminal connected to the seventh inverter 212d and receives the sixth intermediate clock signal INT_CLK6, and a second input terminal connected to the seventh inverter 212d and receives the sixth intermediate clock signal INT_CLK6. The eighth mux 210d has a select terminal that receives the select signal SEL. If the select signal SEL is high, then the eighth mux 210d outputs the sixth intermediate clock signal INT_CLK6 as the eighth intermediate signal INT8. The eighth inverter 214d is connected to the output terminal of the eighth mux 210d and receives the eighth intermediate signal INT8. The eighth inverter 214d outputs the fourth intermediate clock signal INT_CLK4. The eighth mux 210d has a first input terminal connected to the The number of delay cells in each of the first and second sets of delay cells 204 and 206 depends on the first and second delay time intervals $T_{DELAY1}$ and $T_{DELAY2}$ and the delay introduced by each delay cell. For example, the first and second delay time intervals $T_{DELAY1}$ and $T_{DELAY2}$ are equal to 1 ms and 2 ms, respectively, and the delay introduced by each delay cell is 0.5 ms. Hence, each of the first and second sets of delay cells includes two delay cells to introduce a delay of 1 ms in the clock signal CLK and the first delayed clock signal CLK_DELAY1.

The second delay circuit 202b is connected to the first delay cell 204a and receives the first delayed clock signal CLK_DELAY1. The second delay circuit 202b is structurally and functionally similar to the first delay circuit 202a. The second delay circuit 202b introduces a delay that is equal to the first delay time interval $T_{DELAY1}$ in the first delayed clock signal CLK_DELAY1. In other words, the second delay circuit 202b introduces a second delay time interval $T_{DELAY2}$ which is twice the first delay time interval $T_{DELAY1}$ in the clock signal CLK. Thus, the second delay circuit 202b generates a second delayed clock signal CLK_DELAY2.

Figure 3:
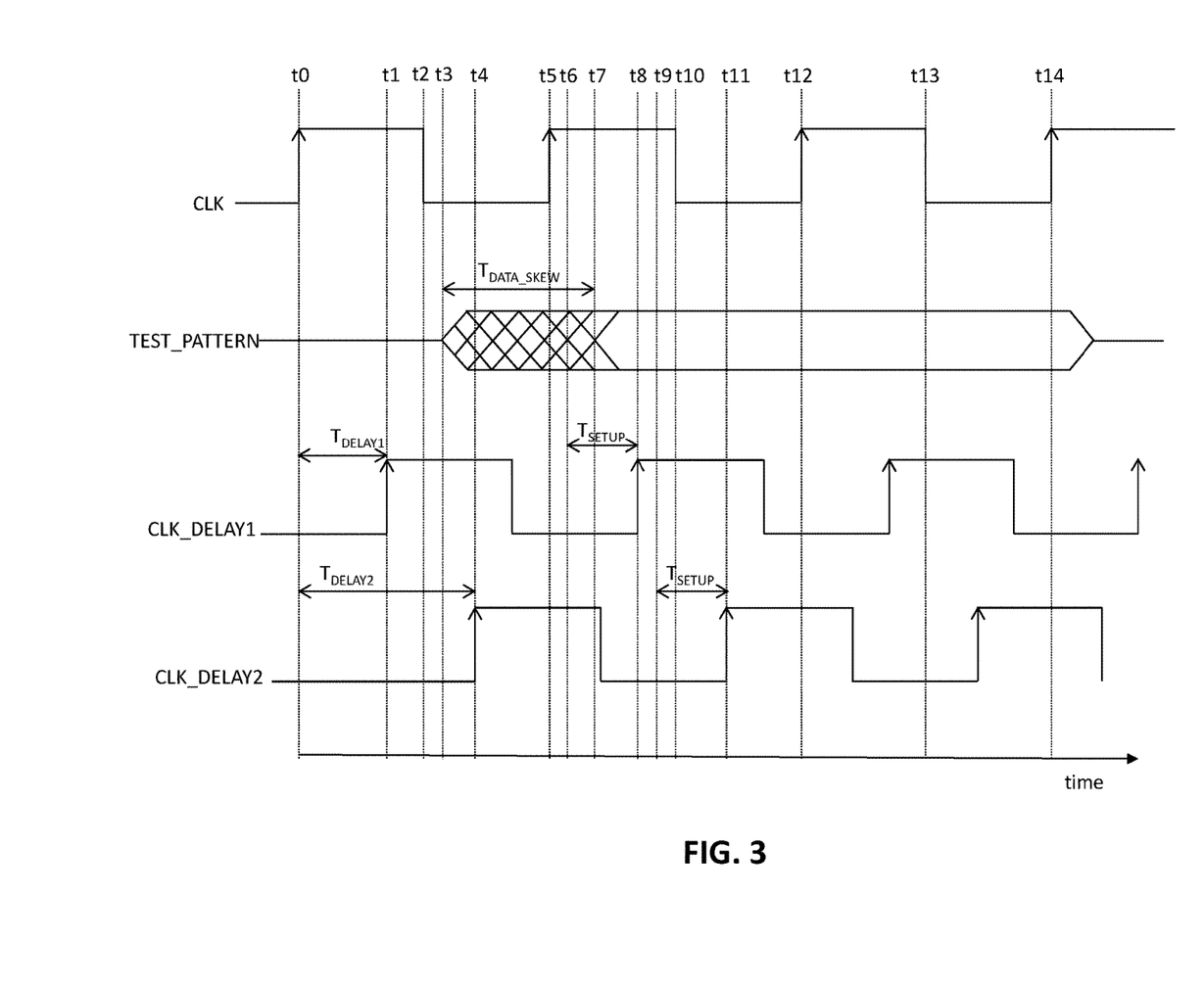
FIG. 3 is a graph illustrating various signals of the memory controller of FIG. 1 over time.

FIG. 3 shows timing diagrams of the clock signal CLK, the test pattern TEST_PATTERN, the set of delayed clock signals CLK_DELAY—two of which are shown—the first delayed clock signal CLK_DELAY1, and the second delayed clock signal CLK_DELAY2 of the memory controller 104 of the IC 100. In the presently preferred embodiment, each of the set of flip-flops 110 samples the test pattern TEST_PATTERN and the read data RD_DATA at a rising edge of the corresponding delayed clock signal of the set of delayed clock signals CLK_DELAY.

The memory controller 104 receives a rising edge of the clock signal CLK at time t0. The clock delay generator 108 delays the clock signal CLK by the first and second delay time intervals $T_{DELAY1}$ and $T_{DELAY2}$ and generates the first and second delayed clock signals CLK_DELAY1 and CLK_DELAY2, respectively. The memory controller 104 generates the first delayed clock signal CLK_DELAY1 with the rising edge at time t1. The set of flip-flops 110 receives the test pattern TEST_PATTERN at time t3. The test pattern TEST_PATTERN is unstable from time t3 to time t7, i.e., the data skew time interval $T_{DATA\_SKEW}$ ranges from time t3 to time t7 (represented as "t3-t7"). The memory controller 104 generates the second delayed clock signal CLK_DELAY2 with a rising edge at time t4. The first delayed clock signal CLK_DELAY1 has a rising edge at time t8. The set up time interval $T_{SETUP}$ is measured before the rising edge of the first delayed clock signal CLK_DELAY1. In one embodiment, the set up time interval $T_{SETUP}$ ranges from time t6 to time t8 (represented as "t6-t8"). The test pattern TEST_PATTERN is unstable during the set up time interval $T_{SETUP}$ t6-t8. Hence, the first flip-flop 110a inaccurately samples the test pattern TEST_PATTERN at the rising edge of the first delayed clock signal CLK_DELAY1 at time t8.

The second delayed clock signal CLK_DELAY2 has the rising edge at time t11. The set up time interval $T_{SETUP}$ is measured before the rising edge of the second delayed clock signal CLK_DELAY2. In one embodiment, the set up time interval $T_{SETUP}$ ranges from time t9 to time t11 (represented as "t9-t11"). The test pattern TEST_PATTERN is stable during the set up time interval $T_{SETUP}$ t9-t11. Hence, the second flip-flop 110b accurately samples the test pattern TEST_PATTERN at the rising edge of the second delayed clock signal CLK_DELAY2.

The first and second flip-flops 110a and 110b generate the first and second sampled test patterns SAMPL_TEST_PATTERN1 and SAMPL_TEST_PATTERN2, respectively. The first and second registers 112a and 112b receive and store the first and second sampled test patterns SAMPL_TEST_PATTERN1 and SAMPL_TEST_PATTERN2. The control circuit 114 receives the first and second sampled test patterns SAMPL_TEST_PATTERN1 and SAMPL_TEST_PATTERN2 as the first and second stored test patterns STORED_TEST_PATTERN1 and STORED_TEST_PATTERN2, respectively. Further, the control circuit 114 compares each of the first and second stored test patterns STORED_TEST_PATTERN1 and STORED_TEST_PATTERN2 with the test pattern TEST_PATTERN. The control circuit 114 determines that the second stored test pattern STORED_TEST_PATTERN2 is equal to the test pattern TEST_PATTERN. Hence, the control circuit 114 determines the second delayed clock signal CLK_DELAY2 as the read clock signal.

The first and second flip-flops 110a and 110b receive the read data RD_DATA and generate the first and second sampled read data SAMPL_RD_DATA1 and SAMPL_RD_DATA2, respectively. The first and second registers 112a and 112b receive and store the first and second sampled read data SAMPL_RD_DATA1 and SAMPL_RD_DATA2, respectively. The first and second registers 112a and 112b output the first and second stored read data STORED_RD_DATA1 and STORED_RD_DATA2, respectively. Since the second stored read data STORED_RD_DATA2 corresponds to the read clock signal, the control circuit 114 outputs the second stored read data STORED_RD_DATA2 to the processor 102.

The memory controller 104 selects one of the delayed clock signals of the set of delayed clock signals CLK_DELAY as the read clock signal RD_CLK. The memory controller 104 samples the read data RD_DATA using the read clock signal after a predetermined time interval has elapsed. This ensures that the read data RD_DATA is sampled accurately. A sampling frequency of the read data RD_DATA depends on the frequency of the read clock signal and not on the predetermined time interval. Thus, the memory controller 104 matches the sampling frequency of the read data RD_DATA with the frequency of the clock signal CLK provided by the processor 102. Each of the delayed clock signals has a frequency that is equal to the frequency of the clock signal CLK. Hence, the memory controller 104 operates at the same frequency as that of the processor 102. The memory controller 104 does not introduce a delay in the execution of the read transaction. Consequently, the processor 102 performs its operations without a delay. Further, the power consumption of the memory controller 104 is reduced.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A memory controller for processing a read transaction request, wherein the memory controller is connected to a processor for receiving the read transaction request and a clock signal and a memory for receiving read data corresponding to the read transaction request and a test pattern, the memory controller comprising:
   a clock delay generator connected to the processor, wherein the clock delay generator receives the clock signal and generates a set of delayed clock signals using a set of delay time intervals;
   a set of flip-flops that receives the test pattern, wherein the set of flip-flops is connected to the clock delay generator and the memory for receiving the set of delayed clock signals and the read data, respectively, and wherein the set of flip-flops samples the test pattern and the read data using each of the delayed clock signals of the set of delayed clock signals, and generates a set of sampled test patterns corresponding to the set of delayed clock signals and a set of sampled read data corresponding to the set of delayed clock signals; and
   a control circuit connected to the set of flip-flops for receiving the set of sampled test patterns and the set of sampled read data, and connected to the clock delay generator for receiving the set of delayed clock signals, wherein the control circuit compares each of the sampled test patterns of the set of sampled test patterns with the test pattern, selects a one of the delayed clock signals of the set of delayed clock signals as a read clock signal based on the comparison of the test pattern and the set of sampled test patterns, and outputs to the processor the sampled read data of the set of sampled read data that corresponds to the read clock signal, wherein the control circuit selects the one of the delayed clock signals as the read clock signal when a corresponding sampled test pattern is equal to the test pattern.

2. The memory controller of claim 1, wherein the test pattern is stored in the memory.

3. The memory controller of claim 1, wherein:
   the control circuit is connected to the processor for receiving the read transaction request, and
   the control circuit and the set of flip-flops receive the test pattern when the control circuit receives the read transaction request.

4. The memory controller of claim 3, wherein the clock delay generator includes a set of delay circuits for generating the set of delayed clock signals, and wherein the set of delay circuits includes:
   a first delay circuit connected to the processor for receiving the clock signal and generating a first delayed clock signal; and
   a second delay circuit connected to the first delay circuit for receiving the first delayed clock signal and generating a second delayed clock signal.

5. The memory controller of claim 4, wherein the first and second delay circuits include first and second sets of delay cells, respectively, wherein the first set of delay cells includes:
   a first delay cell that receives the clock signal and a first intermediate clock signal, and generates a second intermediate clock signal and the first delayed clock signal; and
   a second delay cell connected to the first delay cell for receiving the second intermediate clock signal and generating a third intermediate clock signal and the first intermediate clock signal, and
   wherein the second set of delay cells includes:
   a third delay cell that receives the first delayed clock signal and a fourth intermediate clock signal, and generates a fifth intermediate clock signal and the second delayed clock signal; and a fourth delay cell connected to the third delay cell for receiving the fifth intermediate clock signal and generating a sixth intermediate clock signal and the fourth intermediate clock signal.

6. The memory controller of claim 5, wherein each of the first through fourth delay cells includes:
a first multiplexer having a first input terminal for receiving one of the clock signal, the second intermediate clock signal, the first delayed clock signal, and the fifth intermediate clock signal, a second input terminal for receiving a predetermined input signal, a select terminal for receiving a select signal, and an output terminal for outputting one of the clock signal and the predetermined input signal as a first intermediate signal, one of the second intermediate clock signal and the predetermined input signal as a second intermediate signal, one of the first delayed clock signal and the predetermined input signal as a third intermediate signal, and one of the fifth intermediate clock signal and the predetermined input signal as a fourth intermediate signal;
a first inverter connected to the first multiplexer for receiving the one of the first through fourth intermediate signals and generating one of the second intermediate clock signal, the third intermediate clock signal, the fifth intermediate clock signal, and the sixth intermediate clock signal based on the one of the first through fourth intermediate signals;
a second multiplexer having a first input terminal connected to the first inverter for receiving the one of the second intermediate clock signal, the third intermediate clock signal, the fifth intermediate clock signal, and the sixth intermediate clock signal, a second input terminal for receiving one of the first intermediate clock signal, the third intermediate clock signal, the fourth intermediate clock signal, and the sixth intermediate clock signal, a select terminal for receiving the select signal, and an output terminal for outputting one of the second and first intermediate clock signals as a fifth intermediate signal, the third intermediate clock signal as a sixth intermediate signal, at least one of the fifth and fourth intermediate clock signals as a seventh intermediate signal, and the sixth intermediate clock signal as an eighth intermediate signal; and
a second inverter connected to the second multiplexer for receiving the at least one of the fifth through eighth intermediate signals and generating at least one of the first delayed clock signal, the first intermediate clock signal, the second delayed clock signal, and the fourth intermediate clock signal based on the at least one of the fifth through eighth intermediate signals.

7. The memory controller of claim 5, wherein a number of delay circuits in the set of delay circuits is based on a predetermined time interval and the clock signal.

8. The memory controller of claim 7, wherein a number of delay cells in each delay circuit is based on the predetermined time interval.

9. The memory controller of claim 1, further comprising:
a set of registers connected to the control circuit,
wherein the clock delay generator receives the set of delayed clock signals, and the set of flip-flops receives the set of sampled test patterns and the set of sampled read data, and
wherein the set of registers stores the set of sampled test patterns and the set of sampled read data, and outputs the set of sampled test patterns and the set of sampled read data as a set of stored data based on the corresponding set of delayed clock signals, wherein the set of flip-flops is connected to the control circuit by way of the corresponding set of registers.

10. An integrated circuit (IC), comprising:
a processor that generates a read transaction request and a clock signal;
a memory that stores read data and a test pattern; and
a memory controller connected between the processor and the memory, for receiving the read data and the test pattern from the memory, and the read transaction request and the clock signal from the processor, wherein the memory controller generates a read clock signal for sampling the read data, and outputs sampled read data, wherein the memory controller comprises:
a clock delay generator connected to the processor for receiving the clock signal, delaying the clock signal by a set of delay time intervals, and generating a set of delayed clock signals based on the set of delay time intervals;
a set of flip-flops that receives the test pattern and the read data from the memory, and the set of delayed clock signals from the clock delay generator, samples the test pattern and the read data using each of the delayed clock signals of the set of delayed clock signals, and generates a set of sampled test patterns corresponding to the set of delayed clock signals, and a set of sampled read data corresponding to the set of delayed clock signals; and
a control circuit connected to the set of flip-flops for receiving the set of sampled test patterns and the set of sampled read data, and connected to the clock delay generator for receiving the set of delayed clock signals, wherein the control circuit compares each of the sampled test patterns of the set of sampled test patterns with the test pattern, and selects a one of the delayed clock signals of the set of delayed clock signals as a read clock signal based on the comparison of the test pattern and the set of sampled test patterns, and outputs the sampled read data of the set of sampled read data that corresponds to the read clock signal, wherein the control circuit determines the one delayed clock signal as the read clock signal when a corresponding sampled test pattern is equal to the test pattern.

11. The IC of claim 10, wherein the control circuit receives the read transaction request from the processor, and wherein the control circuit and the set of flip-flops receive the test pattern when the control circuit receives the read transaction request.

12. The IC of claim 11, wherein the clock delay generator includes a set of delay circuits, and wherein the set of delay circuits includes:
a first delay circuit connected to the processor for receiving the clock signal and generating a first delayed clock signal; and
a second delay circuit connected to the first delay circuit for receiving the first delayed clock signal and generating a second delayed clock signal.

13. The IC of claim 12, wherein a number of delay circuits in the set of delay circuits is based on a predetermined time interval and the clock signal.

14. The IC of claim 13, wherein the first and second delay circuits include first and second sets of delay cells, respectively, wherein the first set of delay cells includes:
a first delay cell that is connected to the processor, receives the clock signal and a first intermediate clock signal, and generates a second intermediate clock signal and the first delayed clock signal; and a second delay cell that is connected to the first delay cell for receiving the second intermediate clock signal and generating a third intermediate clock signal and the first intermediate clock signal, and wherein the second set of delay cells includes:

a third delay cell that is connected to the first delay cell, receives the first delayed clock signal and a fourth intermediate clock signal, and generates a fifth intermediate clock signal and the second delayed clock signal; and a fourth delay cell that is connected to the third delay cell for receiving the fifth intermediate clock signal and generating a sixth intermediate clock signal and the fourth intermediate clock signal.

15. The IC of claim 14, wherein each of the first through fourth delay cells includes:

a first multiplexer having a first input terminal for receiving at least one of the clock signal, the second intermediate clock signal, the first delayed clock signal, and the fifth intermediate clock signal, a second input terminal for receiving a predetermined input signal, a select terminal for receiving a select signal, and an output terminal for outputting one of the clock signal and the predetermined input signal as a first intermediate signal, one of the second intermediate clock signal and the predetermined input signal as a second intermediate signal, one of the first delayed clock signal and the predetermined input signal as a third intermediate signal, and one of the fifth intermediate clock signal and the predetermined input signal as a fourth intermediate signal;

a first inverter connected to the first multiplexer for receiving the at least one of the first through fourth intermediate signals and generating at least one of the second intermediate clock signal, the third intermediate clock signal, the fifth intermediate clock signal, and the sixth intermediate clock signal based on the at least one of the first through fourth intermediate signals;

a second multiplexer having a first input terminal connected to the first inverter for receiving the one of the second intermediate clock signal, the third intermediate clock signal, the fifth intermediate clock signal, and the sixth intermediate clock signal, a second input terminal for receiving one of the first intermediate clock signal, the third intermediate clock signal, the fourth intermediate clock signal, and the sixth intermediate clock signal, a select terminal for receiving the select signal, and an output terminal for outputting one of the second and first intermediate clock signals as a fifth intermediate signal, the third intermediate clock signal as a sixth intermediate signal, at least one of the fifth and fourth intermediate clock signals as a seventh intermediate signal, and the sixth intermediate clock signal as an eighth intermediate signal; and a second inverter connected to the second multiplexer for receiving the one of the fifth through eighth intermediate signals and generating one of the first delayed clock signal, the first intermediate clock signal, the second delayed clock signal, and the fourth intermediate clock signal based on the one of the fifth through eighth intermediate signals.

16. The IC of claim 15, wherein a number of delay cells in each delay circuit is based on the predetermined time interval.

17. The IC of claim 10, further comprising:

a set of registers connected to the control circuit, wherein the clock delay generator receives the set of delayed clock signals, and the set of flip-flops receives the set of sampled test patterns and the set of sampled read data, wherein the set of registers stores the set of sampled test patterns and the set of sampled read data, and outputs the set of sampled test patterns and the set of sampled read data as a set of stored data based on the corresponding set of delayed clock signals, and wherein the set of flip-flops is connected to the control circuit by way of the set of registers.

* * * * *